United States Patent
Oi

(10) Patent No.: US 9,133,654 B2
(45) Date of Patent: Sep. 15, 2015

(54) COVER LOCKING MECHANISM FOR ELECTRONIC APPARATUS

(71) Applicant: KYOCERA Corporation, Kyoto-shi, Kyoto (JP)

(72) Inventor: Atsuki Oi, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 360 days.

(21) Appl. No.: 13/682,713

(22) Filed: Nov. 20, 2012

(65) Prior Publication Data
US 2013/0135799 A1    May 30, 2013

(30) Foreign Application Priority Data

Nov. 24, 2011    (JP) .................. 2011-255729

(51) Int. Cl.
| | |
|---|---|
| H05K 7/00 | (2006.01) |
| H05K 5/00 | (2006.01) |
| E05C 3/00 | (2006.01) |
| H05K 5/02 | (2006.01) |
| E05C 3/04 | (2006.01) |
| H04M 1/02 | (2006.01) |
| E05B 15/00 | (2006.01) |

(52) U.S. Cl.
CPC .............. *E05C 3/004* (2013.01); *E05C 3/041* (2013.01); *H04M 1/0262* (2013.01); *H05K 5/0221* (2013.01); *E05B 2015/0066* (2013.01)

(58) Field of Classification Search
CPC .............................. B60K 15/04; H04M 1/0247
USPC ............... 361/679.01–679.09, 679.1–679.19, 361/679.21–679.29, 679.31–679.45, 361/679.55–679.6, 724–747; 248/917–924, 248/80–88, 155.1–155.5, 166–173, 248/180.1–186.2, 229.1–231.51, 271.4, 248/292.14, 316.1–316.8; 369/75.1, 75.2, 369/75.11, 75.21, 76, 77.11, 77.21, 78, 79, 369/80, 81, 82
See application file for complete search history.

(56) References Cited

U.S. PATENT DOCUMENTS

| | | | |
|---|---|---|---|
| 2008/0055829 A1* | 3/2008 | Ko et al. .................. | 361/681 |
| 2009/0020182 A1* | 1/2009 | Groom et al. ............. | 141/349 |

FOREIGN PATENT DOCUMENTS

| | | |
|---|---|---|
| JP | H03-060194 A | 3/1991 |
| JP | 2001-336522 A | 12/2001 |
| JP | 2008-010599 A | 1/2008 |

OTHER PUBLICATIONS

Office Action dated Nov. 4, 2014, issued in counterpart Japanese Application 2011-255729.

* cited by examiner

*Primary Examiner* — Jerry Wu
(74) *Attorney, Agent, or Firm* — Procopio, Cory, Hargreaves & Savitch LLP

(57) ABSTRACT

A cover locking mechanism according to the present invention comprise a seat formed at the cabinet, a locking operation piece that is mounted on the seat of the cabinet and can be turned between a locked position, at which the cover is locked, and an unlocked position, at which the cover is unlocked, and a stopper mechanism configured to prevent the locking operation piece from slipping off. The locking operation piece includes an elastic piece that can be elastically deformed along the turn axis of the locking operation piece at a portion facing the seat of the cabinet, the elastic piece having a fitting portion formed toward the seat of the cabinet, and further, the seat having a engaged portion which releasably engage the engaging portion at a locked position of the locking operation piece.

5 Claims, 4 Drawing Sheets

COVER LOCKING MECHANISM FOR ELECTRONIC APPARATUS

CROSS-REFERENCE TO RELATED APPLICATION

This patent application is based upon and claims the benefit of priority from Japanese Patent Application No. 2011-255729, all of which are incorporated herein by reference in their entirety.

BACKGROUND OF THE INVENTION

1. Field of the Invention

The present invention relates to a cover locking mechanism for locking a cover such as a battery cover at a closed position in an electronic apparatus such as a mobile phone.

2. Description of Related Art

Conventionally, in an electronic apparatus of this type, a battery cover 91 is attached to a rear surface of a cabinet 9, as shown in FIGS. 5A and 5B. When a locking operation piece 92 is turned from a locked position shown in FIG. 5A to an unlocked position shown in FIG. 5B, the battery cover 91 is unlocked, so that the battery cover 91 can be detached from the cabinet 9.

In a cover locking mechanism shown in FIGS. 6 and 7, for example, a seat 94 is formed at a back surface of a cabinet 9; a through hole 90 is formed on the seat 94; and a locking operation piece 92 penetrates through the through hole 90 from the front side to the back side of the cabinet 9. Here, a projection 93 is configured to project from the body of the locking operation piece 92.

At the front surface of the seat 94 of the cabinet 9, a first engaged portion 95 and a second engaged portion 96 are recessed at two positions with a phase difference of about 90°.

On the back side of the cabinet 9, a flat spring 8 is disposed at the end surface of the locking operation piece 92 exposed from the through hole 90. The flat spring 8 is fixed at the end surface of the locking operation piece 92 via a screw 80, and thus, serves as a stopper for the locking operation piece 92.

The flat spring 8 is formed in such a manner as to be radially elongated from a hole 82, through which the screw 80 penetrates. At the longitudinal tip of the flat spring 8, an engaging portion 81 that projects toward the seat 94 of the cabinet 9 and releasably engages the first and second engaged portions 95 and 96 on the seat 94 by the resiliency of the flat spring 8 is formed.

In the above-described cover locking mechanism, when the locking operation piece 92 is turned from the locked position shown in FIG. 5A to the unlocked position shown in FIG. 5B, the flat spring 8 shown in FIG. 6 is turned and elastically deformed, and thus, the engaging portion 81 is released from a state fitted to the first engaged portion 95 whereas it comes into a state engaged to the second engaged portion 96.

In this manner, the projection 93 of the locking operation piece 92 shown in FIG. 7 is released from the end of the battery cover 91, so that the battery cover 91 is unlocked.

To the contrary, when the locking operation piece 92 is turned from the unlocked position shown in FIG. 5B to the locked position shown in FIG. 5A, the flat spring 8 shown in FIG. 6 is turned and elastically deformed, and thus, the engaging portion 81 is released from the state engaged to the second engaged portion 96 whereas it comes into the state engaged to the first engaged portion 95.

In this manner, the projection 93 of the locking operation piece 92 shown in FIG. 7 is engaged to the end of the battery cover 91, so that the battery cover 91 is locked at the closed position.

In this manner, the operation of the locking operation piece 92 can lock and unlock the battery cover 91, and further, provides with a click feeling.

However, in the cover locking mechanism shown in FIGS. 6 and 7, the flat spring 8 is made of an expensive material such as copper and is large in longitudinal dimension so as to provide a sufficiently elastic deformability for the flat spring 8 whereas to inhibit the flat spring 8 from being plastically deformed. Therefore, there have arisen problems that not only cost is increased but also an installation space of the cover locking mechanism becomes large due to the large turn radius of the flat spring 8.

An object of the present invention is to provide a cover locking mechanism that can be installed in a reduced space without any need of a flat spring having a large elasticity.

SUMMARY OF THE INVENTION

A cover locking mechanism according to the present invention, included in an electronic apparatus, for locking a cover attached to a cabinet 1 at a closed position, includes:
- a seat 13 formed at the cabinet 1;
- a locking operation piece 3 that is mounted on the seat 13 of the cabinet 1 and can be turned between a locked position, at which the cover is locked, and an unlocked position, at which the cover is unlocked; and
- a stopper mechanism configured to prevent the locking operation piece 3 from slipping off.

The locking operation piece 3 includes an elastic piece 36 that can be elastically deformed along the turn axis of the locking operation piece 3 at a portion facing the seat 13 of the cabinet 1. The elastic piece 36 has an engaging portion 37 formed toward the seat 13 of the cabinet 1, and further, the seat 13 has an engaged portion 11, to and from which the engaging portion 37 can be engaged and released, at a locked position of the locking operation piece 3.

DETAILED DESCRIPTION OF THE PREFERRED EMBODIMENT

An embodiment in which the present invention is carried out in a cover locking mechanism for a mobile phone will be described below with reference to the drawings.

Figure 1:
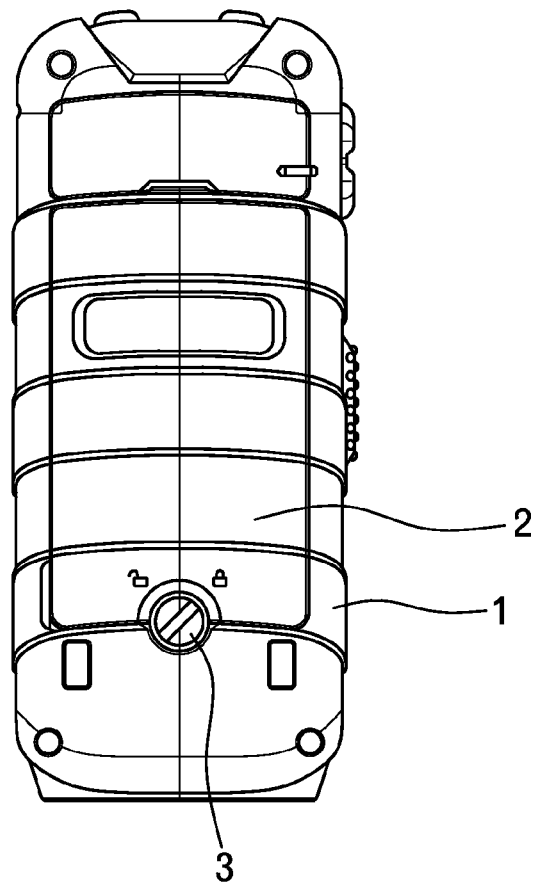
FIG. 1 is a back view showing a mobile phone provided with a cover locking mechanism in an embodiment according to the present invention.

As shown in FIG. 1, a battery cover 2 is disposed at a rear surface of a cabinet 1 in the mobile phone. A locking operation piece 3 is turned, so that the battery cover 2 can be switched between a locked state and an unlocked state.

In a locking operation by the locking operation piece 3 at a closed position shown in FIG. 1, a projection 33 (see FIGS. 2 and 3) projecting from a body 31 of the locking operation piece 3 is engaged to a recess formed at the end of the battery cover 2, so that the battery cover 2 is locked to the cabinet 1 in a locked state.

Figure 2:
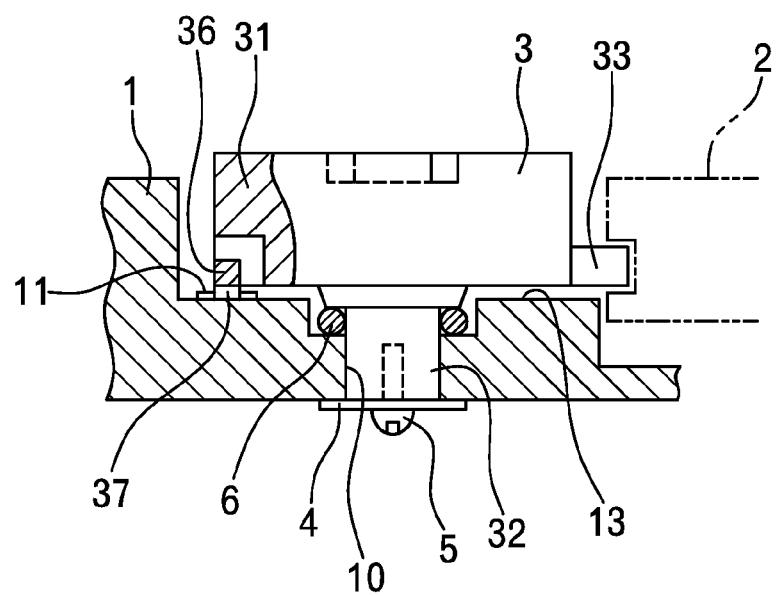
FIG. 2 is an enlarged cross-sectional view showing the cover locking mechanism.
Figure 3:
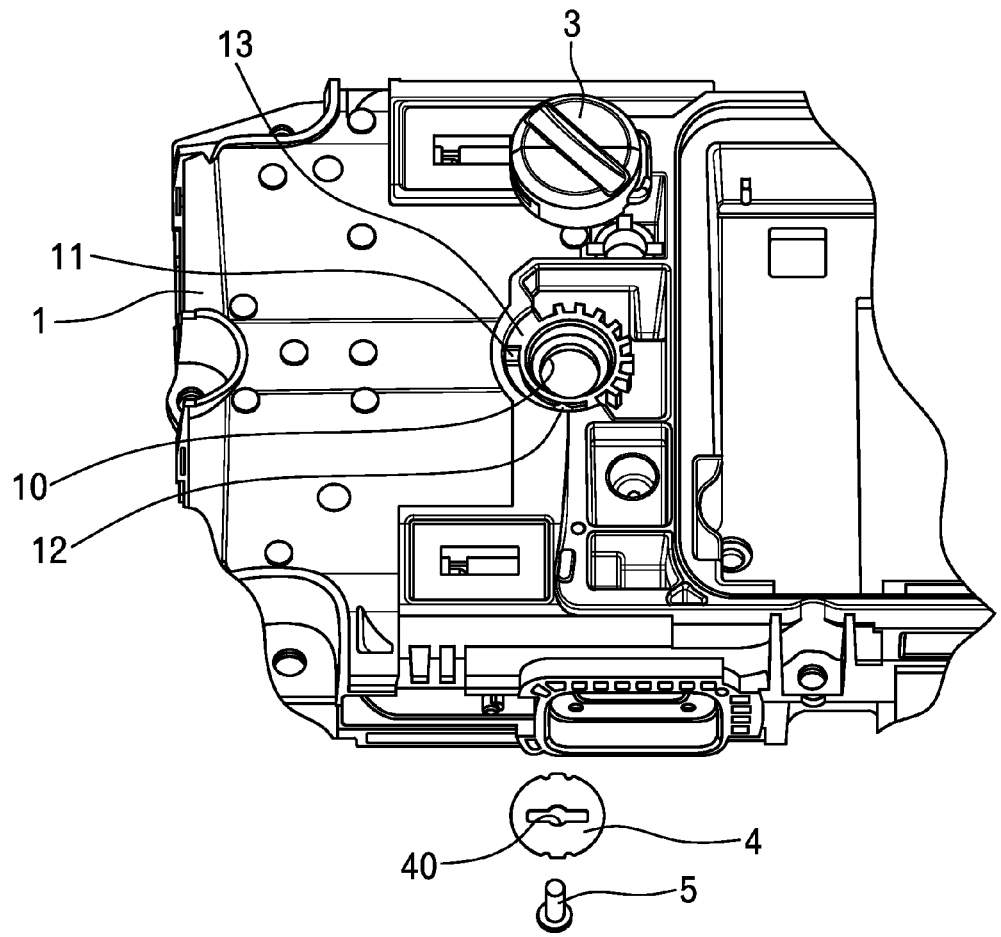
FIG. 3 is an exploded perspective view showing the cover locking mechanism.

The cover locking mechanism in one embodiment according to the present invention includes, as shown in FIGS. 2 and 3, at least: a seat 13 recessed at a surface of the cabinet 1; the locking operation piece 3 made of a synthetic resin and penetrating through a through hole 10 formed on the seat 13 of the cabinet 1; an SUS washer 4 disposed on the rear side of the cabinet 1 and at the end of the locking operation piece 3; and a screw 5 for tightening the washer 4 to the end of the locking operation piece 3, wherein the washer 4 and the screw 5 constitute a stopper mechanism configured to prevent the locking operation piece 3 from slipping off.

Figure 4:
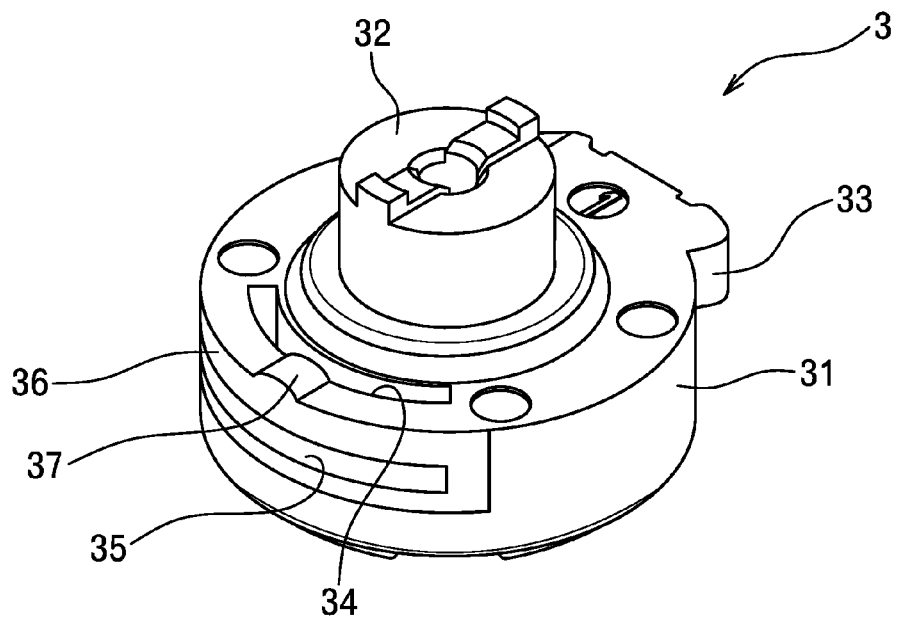
FIG. 4 is an enlarged perspective view showing a locking operation piece constituting the cover locking mechanism.
Figure 5A:
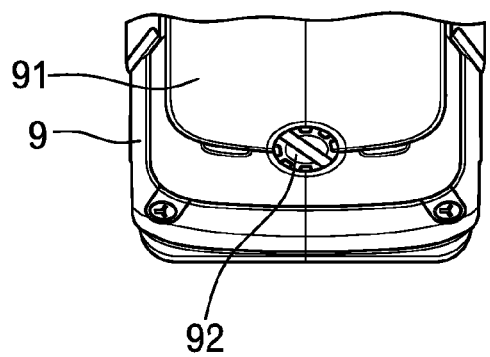
FIG. 5A is a back view showing a locking operation piece at a locked position in a cover locking mechanism for a mobile phone in the prior art.
Figure 5B:
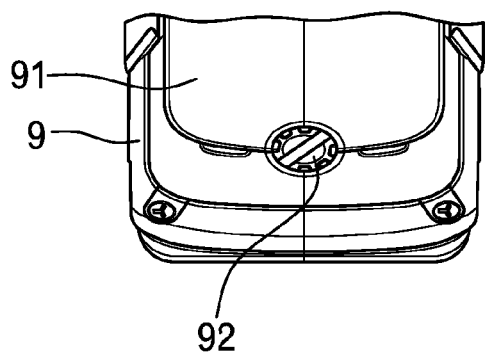
FIG. 5B is a back view showing the locking operation piece at an unlocked position in the cover locking mechanism for the mobile phone in the prior art.
Figure 6:
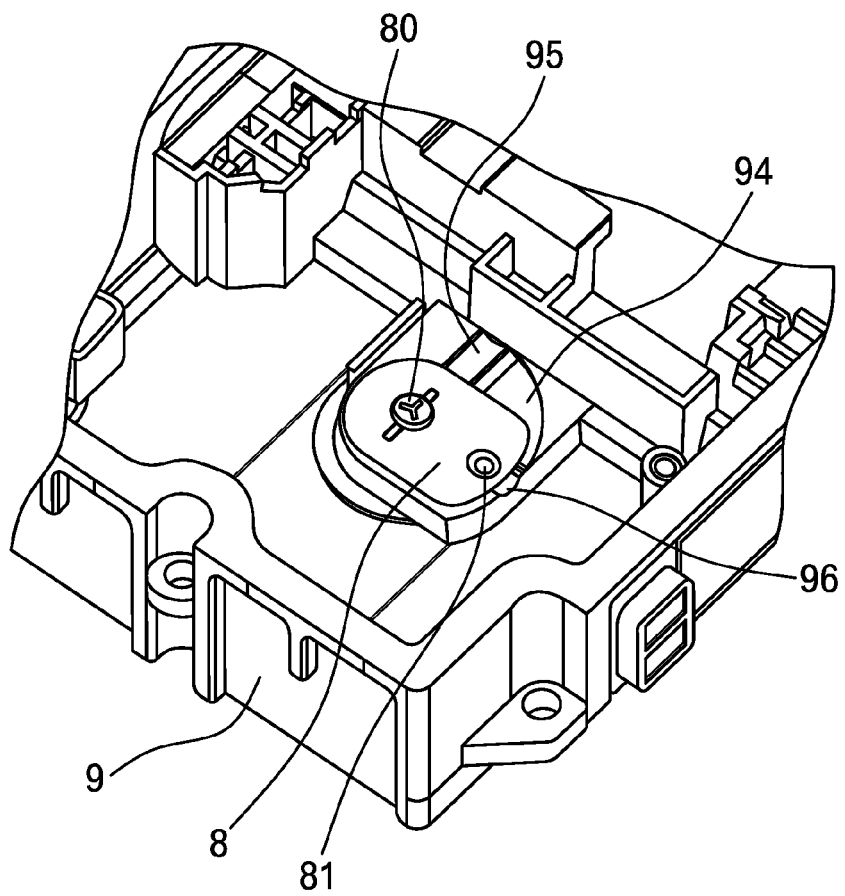
FIG. 6 is an enlarged perspective view showing the cover locking mechanism.
Figure 7:
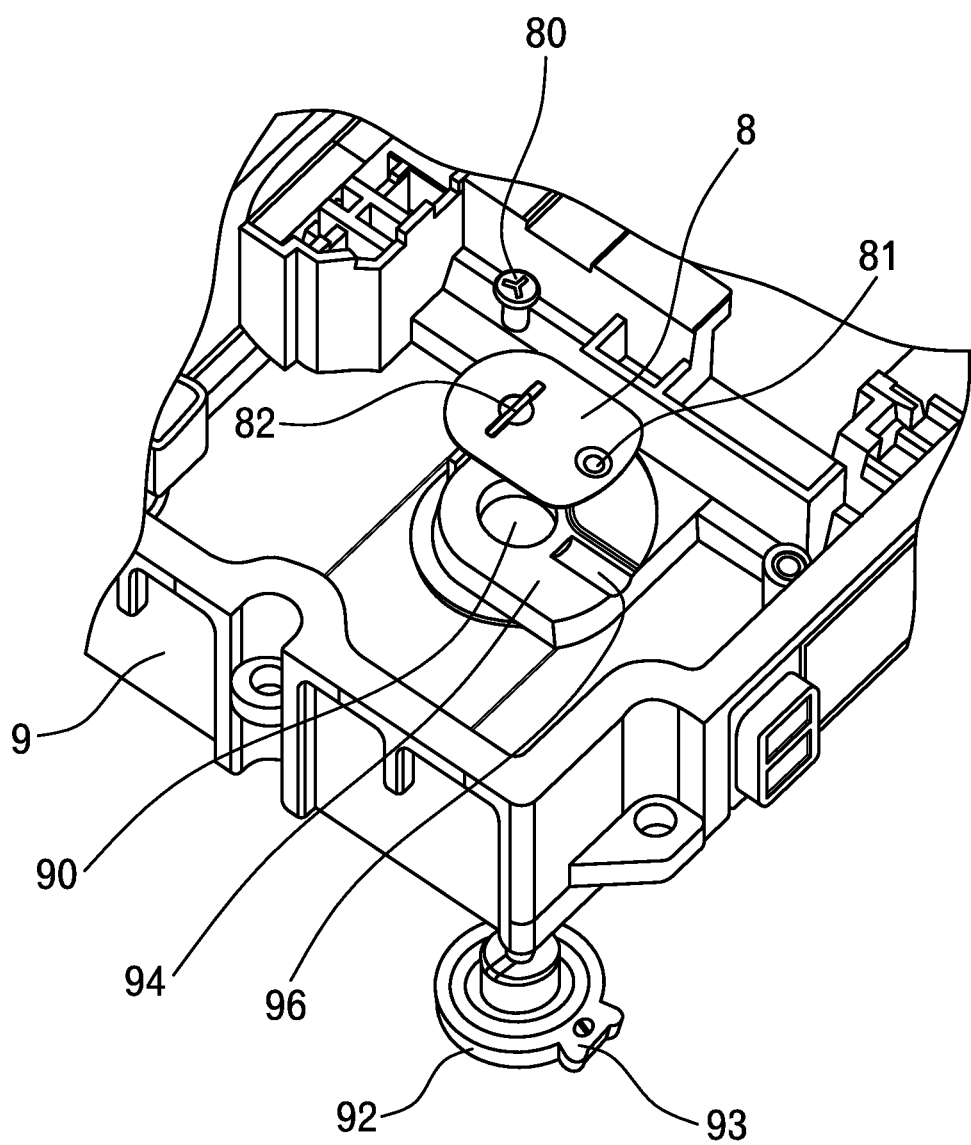
FIG. 7 is an exploded perspective view showing the cover locking mechanism.

As shown in FIG. 4, the locking operation piece 3 includes: a body 31 that is formed into a large diameter disk; and a boss 32 that is formed into a small diameter column and projects from the back side of the body 31, wherein the body 31 has the projection 33 projecting from its outer peripheral surface, the projection 33 being engaged to the battery cover 2 so as to lock the battery cover 2 at the closed position (see FIG. 2).

Moreover, in the body 31 of the locking operation piece 3, a first slit 34 extending along an arcuate line having a center on the turn axis of the locking operation piece 3 is recessed at a surface facing the seat 13 of the cabinet 1. Furthermore, a second slit 35 extending along the arcuate line having a center on the turn axis of the locking operation piece 3 is recessed at the outer peripheral surface of the body 31. The first slit 34 and the second slit 35 cross each other, thereby forming an arcuate elastic piece 36 extending along the arcuate line having a center on the turn axis of the locking operation piece 3.

The elastic piece 36 has a structure supported at both ends and can be elastically deformed in an arcuate manner within the range of the width dimension of the second slit 35.

Additionally, the elastic piece 36 of the locking operation piece 3 has a engaging portion 37 arcuately projecting toward the seat 13 at a surface facing the seat 13 of the cabinet 1.

In the meantime, as shown in FIG. 3, a first engaged portion 11 and a second engaged portion 12 which can releaseably engage the engaging portion 37 of the locking operation piece 3 are recessed on the seat 13 of the cabinet 1 at a phase angle of about 90° in such a manner as to surround the through hole 10.

As shown in FIG. 2, an O-ring 6 is fitted around the boss 32 of the locking operation piece 3 disposed through the through hole 10 of the cabinet 1. The washer 4 is attached to the end of the boss 32 of the locking operation piece 3, and then, the screw 5 is screwed into the boss 32 through a hole 40 formed in the washer 4, thereby preventing the locking operation piece 3 from slipping off.

Moreover, screwing the screw 5 enables the O-ring 6 to be held between the cabinet 1 and the locking operation piece 3, thus providing water resistance between the cabinet 1 and the locking operation piece 3.

As shown in FIG. 1, a battery chamber (not shown) of the cabinet 1 is closed with the battery cover 2. In this state, when the locking operation piece 3 is turned at an angle of about 90° from the unlocked position to the locked position, the engaging portion 37 of the locking operation piece 3 is transitioned from the state engaging to the second engaged portion 12 of the cabinet 1 to the state engaging to the first engaged portion 11 of the cabinet 1.

In contrast, when the locking operation piece 3 is turned at an angle of about 90° from the locked position to the unlocked position, the engaging portion 37 of the locking operation piece 3 is transitioned from the state engaging to the first engaged portion 11 of the cabinet 1 to the state engaging to the second engaged portion 12 of the cabinet 1.

In the state in which the engaging portion 37 of the locking operation piece 3 is engaged to the second engaged portion 12 of the cabinet 1, the projection 33 of the locking operation piece 3 is held in the state released from the end of the battery cover 2: in contrast, in the state in which the engaging portion 37 of the locking operation piece 3 is engaged to the first engaged portion 11 of the cabinet 1, the projection 33 of the locking operation piece 3 is held in the state engaged to the end of the battery cover 2.

Hence, the locking operation piece 3 is turned from the unlocked position to the locked position, so that the elastic piece 36 is elastically deformed, and thus, the engaging portion 37 of the locking operation piece 3 is engaged to the engaged portion 11 at the seat 13 of the cabinet 1. In this manner, the locking operation piece 3 is softly locked at the locked position.

In contrast, during the turn of the locking operation piece 3 at an angle of about 90° from the locked position to the unlocked position, the elastic piece 36 of the locking operation piece 3 is elastically deformed along the turn axis of the locking operation piece 3, thereby providing a click feeling for a bidirectional operation between the locked position and the unlocked position of the locking operation piece 3.

As shown in FIG. 4, the elastic piece 36 is formed along the arcuate line having a center on the turn axis of the locking operation piece 3 in the cover locking mechanism, and therefore, the elastic piece 36 can be elongated without enlarging the outer shape of the locking operation piece 3, thus enhancing the elastic deformability of the elastic piece 36.

Moreover, the washer 4 is adapted to prevent the locking operation piece 3 from slipping off, and therefore, the outer diameter of the washer 4 is just designed to be slightly greater than the inner diameter of the through hole 10 formed in the cabinet 1. Thus, the washer 4 can be prevented from being largely fluctuated according to the turn of the locking operation piece 3.

Consequently, with the cover locking mechanism, the elastic piece 36 is formed at the position facing the seat 13 of the locking operation piece 3 mounted on the seat 13 of the cabinet 1, and therefore, the elastic piece 36 is merely turned within a turn area at the outer peripheral surface of the locking operation piece 3 according to the turn of the locking operation piece 3. Hence, a flat spring having a large turn radius is not needed, unlike in the prior art, thereby reducing an installation space for the cover locking mechanism.

Moreover, an expensive material such as copper is not needed to be used as the material of the washer 4, thus achieving cost reduction.

It is to be noted that, the structure of the constituents of the present invention is not limited to the embodiments, and various changes can be made by those skilled in the art within the range not departing from the spirit of the present invention. For example, the second engaged portion 12 of the cabinet 1 may be omitted. Alternatively, the engaging structure between the fitting portion 37 of the battery cover 2 and the engaged portions 11 and 12 of the cabinet 1 is not limited to that in the above-described preferred embodiment. For example, the present invention can be applied to the various well-known engaging structures (soft locking mechanisms).

Additionally, the present invention is not limited to the locking mechanism for the battery cover in a mobile phone, but may be applied to locking mechanisms for various covers such as a battery cover, a terminal cover, and a memory card cover in an electronic apparatus such as a digital camera and a personal computer.

What is claimed is:

1. A cover locking mechanism included in an electronic apparatus, for locking a cover attached to a cabinet at a closed position, the cover locking mechanism comprising:
    a seat formed at the cabinet;
    a locking operation piece that is mounted on the seat of the cabinet and can be turned between a locked position, at which the cover is locked, and an unlocked position, at which the cover is unlocked; and
    a stopper mechanism configured to prevent the locking operation piece from slipping off the seat of the cabinet,
    wherein the locking operation piece includes an elastic piece that can be elastically deformed along a turn axis of the locking operation piece at a portion facing the seat of the cabinet, the elastic piece having an engaging portion formed from the elastic portion and protruding toward the seat of the cabinet, and the seat having an engaged portion which can releaseably engage the engaging portion at a locked position of the locking operation piece,
    wherein the locking operation piece includes a body having a cylindrical outer peripheral surface,
    wherein the body has a first slit which extends along an arcuate line having a center on the turn axis of the locking operation piece and is recessed at the surface facing the seat of the cabinet in a lateral direction of the cylindrical outer peripheral surface,
    wherein the body has a second slit which extends along the arcuate line having a center on the turn axis of the locking operation piece and is recessed at the outer peripheral surface of the body in a longitudinal direction of the cylindrical outer peripheral surface, and
    wherein the first slit and the second slit meet so as to define the elastic piece.

2. The cover locking mechanism according to claim 1, wherein the elastic piece of the locking operation piece extends along an arcuate line having a center on the turn axis of the locking operation piece.

3. The cover locking mechanism according to claim 1, wherein a second engaged portion is on the seat of the cabinet and releaseably engages the engaging portion at an unlocked position of the locking operation piece.

4. The cover locking mechanism according to claim 2, wherein a second engaged portion is on the seat of the cabinet and releaseably engages the engaging portion at an unlocked position of the locking operation piece.

5. The cover locking mechanism according to claim 1, wherein the locking operation piece includes a boss penetrating through the cabinet, and wherein the stopper mechanism includes a washer attached to the end of the boss of the locking operation piece at the back surface of the cabinet and a screw which holds the washer to the end of the boss of the locking operation piece.

* * * * *